United States Patent
Ito et al.

(10) Patent No.: US 8,227,289 B2
(45) Date of Patent: *Jul. 24, 2012

(54) METHOD FOR PRODUCING SINGLE CRYSTAL SILICON SOLAR CELL AND SINGLE CRYSTAL SILICON SOLAR CELL

(75) Inventors: Atsuo Ito, Gunma (JP); Shoji Akiyama, Gunma (JP); Makoto Kawai, Gunma (JP); Koichi Tanaka, Gunma (JP); Yuuji Tobisaka, Gunma (JP); Yoshihiro Kubota, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 484 days.

This patent is subject to a terminal disclaimer.

(21) Appl. No.: 11/976,020

(22) Filed: Oct. 19, 2007

(65) Prior Publication Data

US 2008/0121275 A1 May 29, 2008

(30) Foreign Application Priority Data

Oct. 30, 2006 (JP) ................................. 2006-294608

(51) Int. Cl.
*H01L 21/00* (2006.01)
(52) U.S. Cl. .......... 438/73; 438/455; 438/458; 438/528; 257/E21.002
(58) Field of Classification Search .................. 438/73, 438/57, 455, 458, 795, 70, 75, 237
See application file for complete search history.

(56) References Cited

U.S. PATENT DOCUMENTS

| | | | |
|---|---|---|---|
| 4,427,839 A | 1/1984 | Hall | |
| 4,773,942 A | 9/1988 | Hamakawa et al. | |
| 4,927,770 A | 5/1990 | Swanson | |
| 5,374,564 A | 12/1994 | Bruel | |
| 5,646,432 A | 7/1997 | Iwaki et al. | |
| 5,665,607 A | 9/1997 | Kawama et al. | |
| 5,811,348 A | 9/1998 | Matsushita et al. | |
| 5,956,571 A | 9/1999 | Yang | |
| 5,972,732 A | 10/1999 | Gee et al. | |

(Continued)

FOREIGN PATENT DOCUMENTS

DE     199 36 941 A1     8/1999

(Continued)

OTHER PUBLICATIONS

Office Action for U.S. Appl. No. 11/976,026; mailed Dec. 24, 2009.

(Continued)

*Primary Examiner* — Jack Chen
(74) *Attorney, Agent, or Firm* — Oliff & Berridge, PLC

(57) ABSTRACT

A method for producing a single crystal silicon solar cell including the steps of: implanting ions into a single crystal silicon substrate; conducting a surface activating treatment for at least one of: the ion implanting surface of the single crystal silicon substrate, and a surface of the transparent insulator substrate; bonding the ion implanting surface of the single crystal silicon substrate and the transparent insulator substrate to each other, such that the surface(s) subjected to the surface activating treatment is/are used as a bonding surface(s); applying an impact to the ion implanted layer; and forming a plurality of diffusion regions having a second conductivity type at the delaminated surface side of the single crystal silicon layer, such that a plurality of first conductivity-type regions and second conductivity-type regions are present at the delaminated surface of the single crystal silicon layer.

4 Claims, 2 Drawing Sheets

U.S. PATENT DOCUMENTS

| | | | |
|---|---|---|---|
| 5,985,742 | A | 11/1999 | Henley et al. |
| 6,013,563 | A | 1/2000 | Henley et al. |
| 6,048,411 | A | 4/2000 | Henley et al. |
| 6,331,208 | B1 | 12/2001 | Nishida et al. |
| 6,391,743 | B1 | 5/2002 | Iwane et al. |
| 6,426,235 | B1 | 7/2002 | Matsushita et al. |
| 6,555,443 | B1 | 4/2003 | Artmann et al. |
| 2002/0011590 | A1 | 1/2002 | Nagashima |
| 2003/0203547 | A1 | 10/2003 | Sakaguchi |
| 2004/0207485 | A1 | 10/2004 | Kawachi et al. |
| 2004/0229444 | A1 | 11/2004 | Couillard et al. |
| 2004/0248379 | A1 | 12/2004 | Maleville et al. |
| 2006/0169316 | A1 | 8/2006 | Thomsen et al. |
| 2008/0099067 | A1 * | 5/2008 | Ito et al. ............ 136/261 |
| 2008/0121278 | A1 * | 5/2008 | Ito et al. ............ 136/256 |
| 2008/0245408 | A1 * | 10/2008 | Ito et al. ............ 136/255 |
| 2009/0007960 | A1 * | 1/2009 | Ito et al. ............ 136/255 |

FOREIGN PATENT DOCUMENTS

| | | |
|---|---|---|
| EP | 0 971 396 A1 | 1/2000 |
| JP | A-63-287077 | 11/1988 |
| JP | A-05-211128 | 8/1993 |
| JP | A-07-106617 | 4/1995 |
| JP | A-7-226528 | 8/1995 |
| JP | 08-213645 | 8/1996 |
| JP | A-8-213645 | 8/1996 |
| JP | A-09-331077 | 12/1997 |
| JP | A-10-93122 | 4/1998 |
| JP | A-11-004008 | 1/1999 |
| JP | A-2000-150940 | 5/2000 |
| JP | A-2001-111080 | 4/2001 |
| JP | A-2001-189477 | 7/2001 |
| JP | A-2001-217443 | 8/2001 |
| JP | A-2003-017723 | 1/2003 |
| JP | A-2004-304622 | 10/2004 |
| JP | A 2004-342909 | 12/2004 |
| JP | A-2006-295037 | 10/2006 |
| JP | A-2006-324530 | 11/2006 |
| WO | WO 2006/093817 | 9/2006 |

OTHER PUBLICATIONS

Office Action for U.S. Appl. No. 12/073,437; mailed Nov. 27, 2009.
Decision of Refusal for Patent Application No. 2006-294608; mailed Feb. 23, 2010 (with translation).
Takahashi K. et al., "Solar Photovoltaic Power Generation," Morikita Shuppan, 1980. Imprint, p. 217 and p. 233.
Office Action for U.S. Appl. No. 12/073,437; mailed May 12, 2010.
Dec. 15, 2010 Japanese Notification of Reasons for Refusal issued in JP-2007-056870 (with Translation).
Dec. 21, 2010 Japanese Outline of a Questioning issued in JP-2006-294490 (with Translation).
Dec. 21, 2010 Japanese Outline of a Questioning issued in JP-2006-294605 (with Translation).
Dec. 21, 2010 Japanese Outline of a Questioning issued in JP-2006-294553 (with Translation).
Dec. 21, 2010 Japanese Outline of a Questioning issued in JP-2006-294608 (with Translation).
Jan. 26, 2011 Office Action issued in Chinese Application No. 2007101851256 (with translation).
Mar. 9, 2011 Office Action issued in Chinese Patent Application No. 200710185124.1 (with partial English-language translation).
Mar. 9, 2011 Office Action issued in Chinese Patent Application No. 200710185123.7 (with partial English-language translation).
May 13, 2011 Extended European Search Report issued in European Application No. 07022106.4.
May 13, 2011 Extended European Search Report issued in European Application No. 07020917.6.
May 13, 2011 Extended European Search Report issued in European Application No. 07020916.8.
May 13, 2011 Extended European Search Report issued in European Application No. 07020918.4.
Apr. 13, 2010 Office Action issued in Chinese Application No. 200710193656.X (with partial translation).
A. V. Shah et al; Thin-film Silicon Solar Cell Technology in Progress in Photovoltaics: Research and Applications Prog. Photovolt: Res. Appl. 2004; 12 pp. 113-142.
Chinese Office Action of Chinese Application No. 2007101851237; issued Dec. 18,2009 (with translation).
Jun. 24, 2010 Office Action issued in Chinese Application No. 200710185124.1 (with partial translation).
Oct. 25, 2010 Office Action issued in U.S. Appl. No. 12/076,916.
Oct. 26, 2010 Office Action issued in U.S. Appl. No. 11/984,182.
Oct. 28, 2010 Office Action issued in U.S. Appl. No. 12/073,437.
Sep. 20, 2011 Appeal Decision issued in Japanese Patent Application No. 2006-294608 (with partial translation).
Nov. 14, 2011 Office Action issued in U.S. Appl. No. 11/976,020.
Dec. 16, 2011 Chinese Office Action issued in Chinese Application No. 200710185126.0 (with partial translation).
May 24, 2011 Notification of Reasons for Refusal issued in Japanese Patent Application No. 2006-294553 with partial translation.
May 24, 2011 Notification of Reasons for Refusal issued in Japanese Patent Application No. 2006-294608 with partial translation.
May 24, 2011 Notification of Reasons for Refusal issued in Japanese Patent Application No. 2006-294490 with partial translation.
May 24, 2011 Notification of Reasons for Refusal issued in Japanese Patent Application No. 2006-294605 with partial translation.

* cited by examiner

METHOD FOR PRODUCING SINGLE CRYSTAL SILICON SOLAR CELL AND SINGLE CRYSTAL SILICON SOLAR CELL

BACKGROUND OF THE INVENTION

1. Field of the Invention

The present invention relates to a method for producing a single crystal silicon solar cell and to a single crystal silicon solar cell, and particularly to a method for producing a single crystal silicon solar cell for forming a single crystal silicon layer on a transparent insulator substrate and to a single crystal silicon solar cell having a single crystal silicon layer over a transparent insulator substrate.

2. Description of the Related Art

Solar cells comprising silicon as main materials are classified into single crystal silicon solar cells, polycrystalline silicon solar cells, and amorphous silicon solar cells, based on crystallinities thereof. Among them, single crystal silicon solar cells are each provided as solar cell elements by cutting a single crystal ingot prepared by a crystal pulling method by a wire saw into a wafer shape slice, working the slice into a wafer having a thickness of 100 to 200 µm, and forming p-n junctions, electrodes, a protective film, and the like thereon.

In case of polycrystalline silicon solar cells, there is fabricated a polycrystalline ingot by crystallizing a molten metal silicon in a mold without relying on crystal pulling, and the ingot is cut into a wafer shape slice by a wire saw in the same manner as single crystal silicon solar cells, and the slice is worked into a wafer having a thickness of 100 to 200 µm, and formed with p-n junctions, electrodes, a protective film, and the like thereon, to provide solar cell elements, in the same manner as a single crystal silicon substrate.

In case of amorphous silicon solar cells, there is formed an amorphous silicon hydride film on a substrate by decomposing a silane gas by discharge in a vapor phase such as by a plasma CVD method, and diborane, phosphine, and the like as doping gases are added thereto, followed by simultaneous deposition thereof to simultaneously achieve a p-n junction formation process and a film-formation process, and followed by formation of electrodes and a protective film, thereby providing solar cell elements. In an amorphous silicon solar cell, since amorphous silicon as a direct transition type absorbs incident light, the amorphous silicon has a light absorption coefficient which is about one order higher than those of single crystal silicon and polycrystalline silicon ("Solar photovoltaic power generation", p. 233, by Kiyoshi Takahashi, Yoshihiro Hamakawa, and Akio Ushirokawa, Morikita Shuppan, 1980), thereby providing an advantage that a thickness of about 1 µm of an amorphous silicon layer will do which is about a hundredth of that of a crystal-based solar cell. Thus, expectation is significant for amorphous silicon solar cells capable of effectively utilizing resources, in view of the fact that the annual production volume of solar cells has recently exceeded 1 giga-watts in the world and the production volume will be further increased.

However, it is inappropriate to determine the effective utilization ratio of resources based on simple comparison with a film thickness required by a crystal-based solar cell, because of exemplary circumstances that high purity gas materials such as silane and disilane are used as starting materials for fabrication of amorphous silicon solar cells, and that the effective utilization ratio of the gas materials includes deposition thereof at locations in a plasma CVD apparatus other than at a substrate. Further, an amorphous silicon solar cell has a conversion efficiency of about 10% whereas a crystal-based solar cell has a conversion efficiency of about 15%, and there is still left a problem of degradation of output characteristic in an amorphous silicon solar cell under light irradiation.

As such, there have been conducted various approaches for developing thin-film solar cells by utilizing silicon crystal-based materials ("Solar photovoltaic power generation", p. 217, by Kiyoshi Takahashi, Yoshihiro Hamakawa, and Akio Ushirokawa, Morikita Shuppan, 1980). For example, there is deposited a polycrystalline thin-film on an alumina substrate, graphite substrate, or the like, by using a trichlorosilane gas, a tetrachlorosilane gas, or the like. The thus deposited film has a lot of crystal defects, and the conversion efficiency is low as it is. Thus, it is required to conduct zone melting to improve crystallinity, so as to increase the conversion efficiency (see JP-A-2004-342909, for example). However, even by conducting such a zone melting method, there has been still left an exemplary problem that photocurrent response characteristics in a longer wavelength range are lowered because crystal grain boundaries cause a leak current and shorten lifetimes of carriers.

SUMMARY OF THE INVENTION

The present invention has been carried out in view of the above problem, and it is therefore an object of the present invention to provide a single crystal silicon solar cell and a production method thereof, which single crystal silicon solar cell acts as a silicon solar cell where a light conversion layer is provided as a thin-film for effective utilization of silicon as a starting material of the silicon solar cell, which single crystal silicon solar cell is excellent in conversion characteristics and is less in degradation due to light irradiation, and which single crystal silicon solar cell is provided as a see-through type solar cell that is usable as a natural lighting window material of a house or the like and that transmits part of received visible light therethrough.

To achieve the above object, the present invention provides a method for producing a single crystal silicon solar cell, the solar cell including a transparent insulator substrate and a single crystal silicon layer arranged over the transparent insulator substrate and acting as a light conversion layer, the method comprising at least the steps of:

preparing the transparent insulator substrate and a single crystal silicon substrate having a first conductivity type;

implanting at least one of hydrogen ions and rare gas ions into the single crystal silicon substrate through an ion implanting surface thereof to form an ion implanted layer in the single crystal silicon substrate;

conducting a surface activating treatment for at least one of: the ion implanting surface of the single crystal silicon substrate; and at least one surface of the transparent insulator substrate;

bonding the ion implanting surface of the single crystal silicon substrate and the transparent insulator substrate to each other, in a manner that the surface(s) subjected to the surface activating treatment is/are used as a bonding surface(s);

applying an impact to the ion implanted layer to mechanically delaminate the single crystal silicon substrate thereat to leave a single crystal silicon layer;

forming a plurality of diffusion regions having a second conductivity type at the delaminated surface side of the single crystal silicon layer, which conductivity type is different from the first conductivity type, in a manner that a plurality of p-n junctions are formed at least in the plane direction, and that the plurality of first conductivity-type regions and the plurality of second conductivity-type regions are present at the delaminated surface of the single crystal silicon layer;

forming a plurality of first individual electrodes on the plurality of first conductivity-type regions of the single crystal silicon layer, respectively, and a plurality of second individual electrodes on the plurality of second conductivity-type regions, respectively; and forming a first collector electrode for connecting the plurality of first individual electrodes to one another and a second collector electrode for connecting the plurality of second individual electrodes to one another.

By virtue of the method for producing a single crystal silicon solar cell including such steps, it is possible to produce a single crystal silicon solar cell including a single crystal silicon layer as a light conversion layer arranged over a transparent insulator substrate.

Since the single crystal silicon substrate and the transparent insulator substrate are bonded to each other after the surface activation treatment, both substrates can be strongly bonded to each other. This results in a sufficiently strong joining, without applying a high-temperature heat treatment for increasing a bonding force. Further, since the joining surfaces are strongly joined to each other in this way, it becomes possible to subsequently apply an impact to the ion implanted layer to thereby mechanically delaminate the single crystal silicon substrate thereat, thereby forming a thin single crystal silicon layer on the transparent insulator substrate. Thus, the single crystal silicon thin-film can be obtained, even without conducting a heat treatment for delamination.

According to the method for producing a single crystal silicon solar cell including such steps, the formation of the single crystal silicon layer acting as the light conversion layer is achieved by the delamination from the single crystal silicon substrate, thereby enabling an enhanced crystallinity of the single crystal silicon layer. This resultingly enables an enhanced conversion efficiency of the solar cell.

Further, the delamination of the single crystal silicon substrate for formation of the single crystal silicon layer is conducted as mechanical delamination without relying on heating, thereby enabling suppression of introduction of cracks, defects, and the like into the light conversion layer due to a difference of thermal expansion coefficient.

Moreover, the solar cell is made to be a thin-film solar cell having the thin layer of silicon, thereby enabling a silicon material to be saved and effectively utilized.

In turn, the electrodes for extraction of electric power are formed on only one side of the light conversion layer, thereby enabling provision of a single crystal silicon solar cell capable of facilitating extraction of electric power.

In this case, the surface activating treatment may be at least one of a plasma treatment and an ozone treatment.

In this way, the surface activating treatment is at least one of a plasma treatment and an ozone treatment, thereby enabling the surface activation to be readily conducted so that the single crystal silicon substrate and the transparent insulator substrate are strongly bonded to each other.

Further, the transparent insulator substrate may be made of any one of quartz glass, crystallized glass, borosilicate glass, and soda-lime glass.

In this way, the transparent insulator substrate is made of any one of quartz glass, crystallized glass, borosilicate glass, and soda-lime glass which are each a transparent insulator substrate having excellent optical characteristics, thereby enabling a see-through type single crystal silicon solar cell to be readily produced. It becomes further possible to readily substitute the thus produced single crystal silicon solar cell for an existing window glass or the like.

Furthermore, the ion implantation is preferably conducted at a depth between 0.1 µm inclusive and 5 µm inclusive from the ion implanting surface.

In this way, the ion implantation is conducted at a depth between 0.1 µm inclusive and 5 µm inclusive from the ion implanting surface, thereby enabling achievement of a thickness between 0.1 µm inclusive and 5 µm inclusive for the single crystal silicon layer as the light conversion layer of the single crystal silicon solar cell to be produced. The single crystal silicon solar cell having the single crystal silicon layer of such a thickness is allowed to obtain a practical efficiency as a thin-film single crystal silicon solar cell and to save an amount of silicon material to be used. Further, the single crystal silicon solar cell having the single crystal silicon layer of such a thickness is capable of assuredly transmitting part of visible light therethrough.

The present invention further provides a single crystal silicon solar cell produced by any one of the above-mentioned methods for producing a single crystal silicon solar cell.

In this way, in the single crystal silicon solar cell produced by any one of the methods for producing a single crystal silicon solar cell, the formation of the single crystal silicon layer acting as the light conversion layer is achieved by the delamination from the single crystal silicon substrate, and the delamination of the single crystal silicon layer is conducted by mechanical delamination without relying on heating, thereby enabling provision of a single crystal silicon layer having an enhanced crystallinity. This allows the solar cell to be a thin-film solar cell having a higher conversion efficiency as compared to the film thickness. Further, the thin-film solar cell including the thin single crystal silicon layer allows for effective utilization of a silicon material.

The present invention further provides a single crystal silicon solar cell comprising:

at least, a transparent insulator substrate, and a single crystal silicon layer, which are laminated to each other;

a plurality of first conductivity-type regions and a plurality of second conductivity-type regions formed in the single crystal silicon layer at a surface side thereof opposite to the transparent insulator substrate side;

a plurality of p-n junctions formed at least in the plane direction of the single crystal silicon layer;

a plurality of first individual electrodes formed on the plurality of first conductivity-type regions of the single crystal silicon layer, respectively, and a plurality of second individual electrodes formed on the plurality of second conductivity-type regions of the single crystal silicon layer, respectively; and a first collector electrode for connecting the plurality of first individual electrodes to one another, and a second collector electrode for connecting the plurality of second individual electrodes to one another.

In this way, the single crystal silicon solar cell comprising:

at least, a transparent insulator substrate, and a single crystal silicon layer, which are laminated to each other;

a plurality of first conductivity-type regions and a plurality of second conductivity-type regions formed in the single crystal silicon layer at a surface side thereof opposite to the transparent insulator substrate side;

a plurality of p-n junctions formed at least in the plane direction of the single crystal silicon layer;

a plurality of first individual electrodes formed on the plurality of first conductivity-type regions of the single crystal silicon layer, respectively, and a plurality of second individual electrodes formed on the plurality of second conductivity-type regions of the single crystal silicon layer, respectively; and a first collector electrode for connecting the plurality of first individual electrodes to one another, and a second collector electrode for connecting the plurality of second individual electrodes to one another;

acts as a silicon solar cell including a light conversion layer arranged over a transparent insulator substrate in which the light conversion layer is made of a single crystal silicon layer, thereby allowing the solar cell to have a higher conversion efficiency as compared to the film thickness of the light conversion layer. Further, the electrodes for extraction of electric power are formed on only one side of the light conversion layer, thereby facilitating extraction of electric power.

In this case, the transparent insulator substrate is preferably made of any one of quartz glass, crystallized glass, borosilicate glass, and soda-lime glass.

In this way, the transparent insulator substrate is made of any one of quartz glass, crystallized glass, borosilicate glass, and soda-lime glass, thereby enabling a provision of a see-through type single crystal silicon solar cell having a superior transparency because these glasses are transparent insulator substrates excellent in optical characteristics. It is also easy to substitute the thus produced single crystal silicon solar cell for an existing window glass or the like.

Furthermore, the single crystal silicon layer desirably has a thickness between 0.1 μm inclusive and 5 μm inclusive.

In this way, the single crystal silicon layer having a thickness between 0.1 μm inclusive and 5 μm inclusive allows to obtain a practical efficiency as a thin-film single crystal silicon solar cell and to save an amount of silicon material to be used. Further, the single crystal silicon solar cell having the single crystal silicon layer of such a thickness is capable of assuredly transmitting part of visible light therethrough.

Moreover, the single crystal silicon solar cell can be desirably seen through from one surface side toward the other surface side.

In this way, the single crystal silicon solar cell can be seen through from one surface side toward the other surface side, so that the solar cell can be applied to various situations such that the solar cell can be substituted for an existing window glass or the like.

According to the method for producing a single crystal silicon solar cell of the present invention, it is possible to produce a see-through type thin-film solar cell which is excellent in crystallinity and has a single crystal silicon layer having a higher conversion efficiency as a light conversion layer. Further, electrodes for extracting an electric power are formed on only one surface side of the light conversion layer, thereby enabling establishment of a single crystal silicon solar cell capable of easy extraction of electric power.

Moreover, the single crystal silicon solar cell according to the present invention acts as a silicon solar cell including a light conversion layer arranged over a transparent insulator substrate in which the light conversion layer is made of a single crystal silicon layer, thereby allowing the solar cell to have a higher conversion efficiency as compared to the film thickness of the light conversion layer.

DETAILED DESCRIPTION OF THE PREFERRED EMBODIMENTS

As described above, there has been demanded a higher conversion efficiency even in a thin-film solar cell capable of saving a silicon material, and as such, it has been demanded to further improve crystallinity in addition to adoption of a crystal-based solar cell.

Under such circumstances, the present inventors have found out that crystallinity of a silicon layer as a light conversion layer can be enhanced by obtaining a single crystal silicon thin-film from a single crystal silicon substrate after once bonding the single crystal silicon substrate and a transparent insulator substrate to each other. Further, the present inventors have conceived that crystallinity of the single crystal silicon layer can be satisfactorily maintained, by activating surfaces of the single crystal silicon substrate and transparent insulator substrate before bonding them to each other to thereby increase a bonding strength therebetween without a high-temperature heat treatment, and by conducting mechanical delamination upon delaminating the single crystal silicon substrate without conducting a high-temperature heat treatment. Moreover, the present inventors have found out that it is not indispensable to form p-n junction interfaces in parallel with a light receiving surface in case of using the thin-film single crystal silicon layer as the light conversion layer, and it is also possible to form p-n junction interfaces in a direction perpendicular to the light receiving surface to establish a structure for extracting a photoelectromotive force. Furthermore, the present inventors have conceived that such a thin-film solar cell is allowed to act as a so-called see-through type solar cell which can be seen through from one surface side toward the other surface side and which is also usable as a window material of a house, thereby completing the present invention.

Although the embodiment of the present invention will be concretely described, the present invention is not limited thereto.

Figure 1:
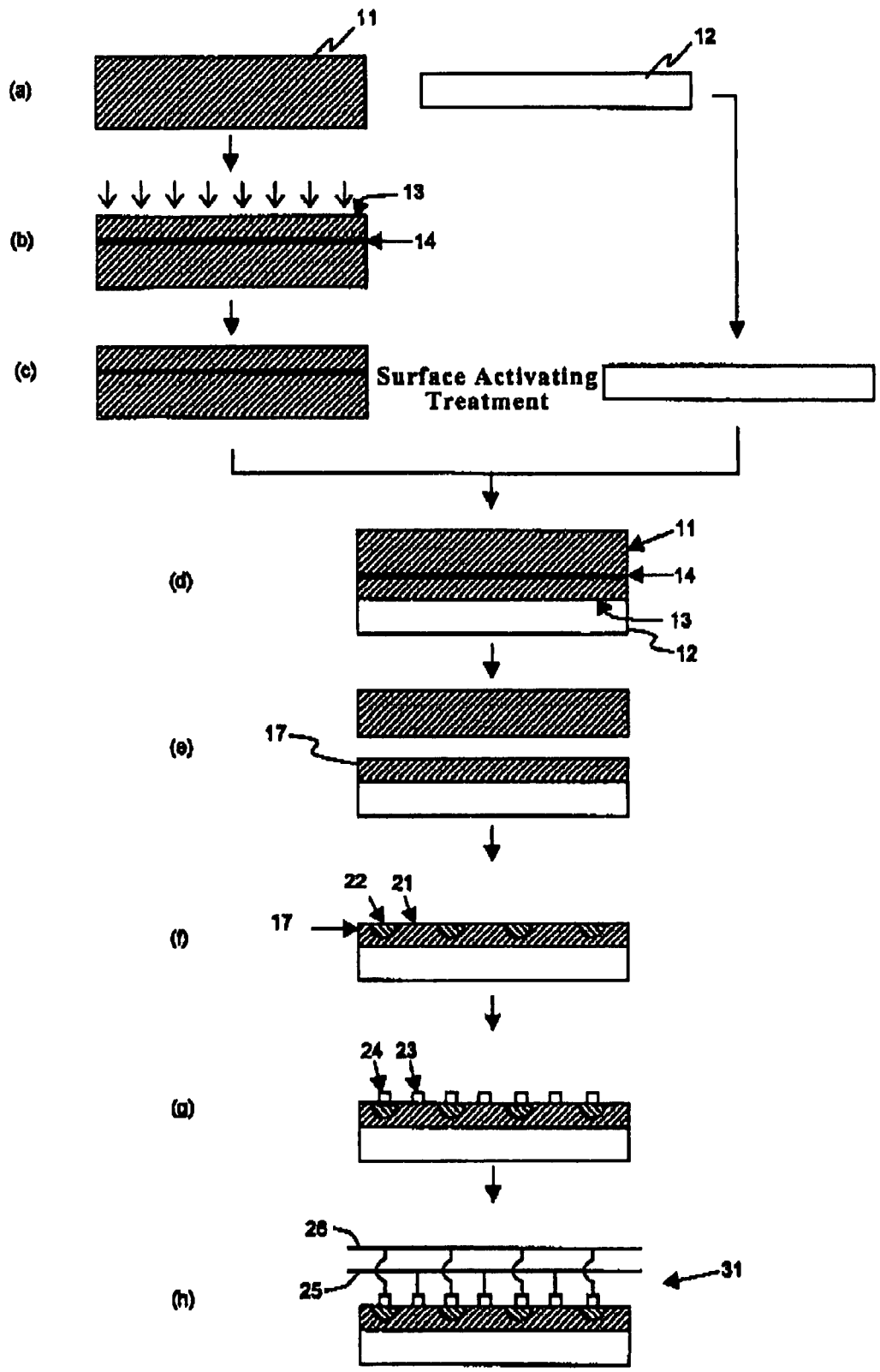
FIG. 1 is a process diagram of an example of a method for producing a single crystal silicon solar cell according to the present invention.

FIG. 1 is a process diagram of an example of a method for producing a single crystal silicon solar cell according to the present invention.

Firstly, there are prepared a single crystal silicon substrate 11 and a transparent insulator substrate 12 (stage "a").

The single crystal silicon substrate is not limited to a particular one, and it is possible to adopt a single crystal silicon substrate which is obtained by slicing a single crystal exemplarily grown by a Czochralski method, and which is 100 to 300 mm in diameter, p-type or n-type in conductivity type, and about 0.1 to 20 Ω·cm in specific resistance, for example.

Further, selected as the transparent insulator substrate is quartz glass, crystallized glass, borosilicate glass, soda-lime glass, or the like. Although selectable glasses are not limited thereto, such glass materials are desirable in view of the fact that they are transparent and are each capable of alternatively acting as a window glass material. Further, in case of adopting a glass material made of general-purpose soda-lime glass as the transparent insulator substrate, it is possible to adopt one having a surface formed with a silicon oxide coating, tin oxide coating (Nesa film), or the like by a dip coating method. Such a coating is desirable because it acts as a buffer film for preventing elution and diffusion of an alkali metal component in the soda-lime glass to the surface of the glass.

Note that the single crystal silicon substrate 11 and the transparent insulator substrate 12 are desirably flattened sufficiently at least at surfaces thereof intended to be bonded to each other, in order to enhance a bonding strength therebetween in the bonding stage "d" to be described later. Such surfaces having higher flatness can be realized by flattening the surfaces by polishing or the like.

Next, at least one of hydrogen ions and rare gas ions is implanted into the single crystal silicon substrate 11, to form an ion implanted layer 14 therein (stage "b").

For example, the temperature of the single crystal silicon substrate is brought to 200 to 450° C., and at least one of hydrogen ions and rare gas ions at a predetermined dosage is implanted into the single crystal silicon substrate at such an implantation energy capable of forming an ion implanted layer 14 at that depth from a surface 13 of the single crystal silicon substrate which corresponds to a desired thickness of a single crystal silicon layer such as a depth of 0.1 to 5 μm or less. In this case, hydrogen ions are particularly desirable, since they are light-weighted and thus can be implanted into a larger depth from the ion implanting surface 13 by the same acceleration energy. The hydrogen ions may be either positive or negative in charge, and may be hydrogen gas ions in addition to hydrogen atom ions. Also in case of rare gas ions, charge thereof may be either positive or negative.

Further, there can be obtained an effect for suppressing channelling of implanted ions, by previously forming an insulator film such as a thin silicon oxide film at a surface of the single crystal silicon substrate, and by achieving ion implantation through the insulator film.

Next, there is conducted a surface activating treatment for at least one of: the ion implanting surface 13 of the single crystal silicon substrate 11; and at least one surface of the transparent insulator substrate 12 (stage "c").

This surface activating treatment is conducted to allow the single crystal silicon substrate 11 and the transparent insulator substrate 12 to be strongly bonded to each other at the next bonding stage "d", and aims at activating the surfaces to be bonded (the ion implanting surface 13 in case of the single crystal silicon substrate 11). The method of the treatment is not particularly limited, and can be preferably conducted by at least one of plasma treatment and ozone treatment.

In case of treatment by plasma, the single crystal silicon substrate 11 and/or transparent insulator substrate 12 having been subjected to cleaning such as RCA cleaning is/are placed in a vacuum chamber, and a gas for plasma is introduced thereinto, followed by exposure to a radio-frequency plasma at about 100 W for about 5 to 10 seconds, thereby plasma treating at least those surfaces intended to be bonded to each other in the stage "d", i.e., the ion implanting surface 13 of the single crystal silicon substrate 11, and either of the main surfaces of the transparent insulator substrate 12. The gas for plasma is not particularly limited, and in case of treating the single crystal silicon substrate, it is possible to use an oxygen gas when the surface is to be oxidized, and to use a hydrogen gas, an argon gas, a mixed gas of them, or a mixed gas of hydrogen gas and helium gas when the surface is not to be oxidized. In case of treatment of the transparent insulator substrate, any one of the noted gases will do.

In case of treatment by ozone, the single crystal silicon substrate 11 and/or transparent insulator substrate 12 having been subjected to cleaning such as RCA cleaning is/are placed in a chamber including the atmospheric air introduced therein, and a gas for plasma such as a nitrogen gas or an argon gas is introduced thereinto, followed by generation of radio-frequency plasma to convert oxygen in the atmospheric air into ozone, thereby ozone treating at least the surface(s) to be subjected to the surface activating treatment. It is possible to conduct one or both of the plasma treatment and ozone treatment.

The surface activating treatment such as plasma treatment or ozone treatment oxidizes and removes organic substances on the surface(s) of the single crystal silicon substrate 11 and/or transparent insulator substrate 12, and increases the number of OH groups at the surface(s), thereby activating the surface(s). Although the surface activating treatment is to be desirably conducted for both the surfaces of the single crystal silicon substrate 11 and the transparent insulator substrate 12, it is possible to conduct the treatment for only one of the surfaces.

Next, the ion implanting surface 13 of the single crystal silicon substrate 11 and the applicable surface of the transparent insulator substrate 12 are bonded to each other, such that the surface(s) having been subjected to the surface activating treatment conducted in the stage "c" is/are used as a bonding surface(s) (stage "d").

Since at least one of the ion implanting surface 13 of the single crystal silicon substrate and the surface of the transparent insulator substrate 12 has been subjected to the surface activating treatment in the stage "c", the substrates can be strongly joined to each other at a strength capable of withstanding mechanical delamination in the later stage, by merely and closely contacting the substrates with each other at a temperature ranging from a room temperature to about 250° C., desirably at about the room temperature, under a reduced pressure or ordinary pressure.

The bonding stage is to be conducted under a temperature condition between a room temperature and about 250° C., without conducting a heat treatment at 300° C. or higher. This is because, when a high-temperature heat treatment at 300° C. or higher is conducted in a state that the single crystal silicon substrate 11 and the transparent insulator substrate 12 are bonded to each other, there is a possibility of occurrence of heat distortion, cracks, debonding, and the like, due to a difference between thermal expansion coefficients of the substrates 11 and 12. In this way, avoidance of a high-temperature heat treatment at 300° C. or higher is also applicable, until completion of delaminative transference from the single crystal silicon substrate 11 in the stage "e" to be described later.

Next, there is applied an impact to the ion implanted layer 14 to mechanically delaminate the single crystal silicon substrate 11 thereat to leave a single crystal silicon layer 17 (stage "e").

In the present invention, since the mechanical delamination is conducted by applying an impact to the ion implanted layer, there is no possibility of occurrence of heat distortion, cracks, delamination, and the like due to heating. Although it is enough that a jet of fluid such as gas, liquid, or the like is continuously or intermittently blown onto the joined wafer from the side thereof so as to apply an impact to the ion implanted layer, the impacting method is not particularly limited insofar as capable of causing mechanical delamination by impact.

Note that it is desirable to conduct delamination of the single crystal silicon substrate upon mechanical delamination thereof, by closely contacting a first auxiliary substrate with the back surface of the transparent insulator substrate and closely contacting a second auxiliary substrate with the back surface of the single crystal silicon substrate. Conducting the mechanical delamination by using such auxiliary substrates, prevents occurrence of small cracks due to warpage and crystal defects due to such cracks in the delaminatedly transferred single crystal silicon layer 17, thereby enabling prevention of degradation of a conversion efficiency of a solar cell. This method exhibits a remarkable effect, in case that each substrate has a small thickness such as about 1 mm or less. For example, when the transparent insulator substrate is made of soda-lime glass and has a thickness of 0.7 mm, delamination is conducted by adopting an auxiliary substrate similarly made of soda-lime glass and by establishing a total thickness of 1 mm or more for both substrates.

Further, it is possible to conduct a heat treatment after conducting the delaminative transference from the single crystal silicon substrate, so as to heal ion implantation damages near the surface of the single crystal silicon layer 17. Since the delaminative transference from the single crystal silicon substrate 11 has been already completed at this time to leave the thin-film single crystal silicon layer 17, cracks and defects accompanying thereto are hardly caused in the single crystal silicon layer even by conduction of a local heat treatment at 300° C. or higher near the surface of the single crystal silicon layer. This is also applicable to the following stages.

Next, there are formed a plurality of diffusion regions 22 having a second conductivity type at the delaminated surface side of the single crystal silicon layer 17, which conductivity type is different from a first conductivity type of the single crystal silicon substrate prepared in the stage "a". At this time, the formation is conducted in a manner that a plurality of p-n junctions are formed at least in the plane direction (i.e., normal lines of p-n junction interfaces have at least a component oriented in the plane direction of the single crystal silicon layer 17), and that the plurality of first conductivity-type regions 21 and the plurality of second conductivity-type regions 22 are present at the delaminated surface of the single crystal silicon layer 17 (stage "f").

When the single crystal silicon substrate 11 prepared in the stage "a" is a p-type single crystal silicon, the first conductivity type is a p-type, so that diffusion regions of an n-type as the second conductivity type are formed. Contrary, in case of an n-type single crystal silicon, the first conductivity type is an n-type, so that diffusion regions of a p-type as the second conductivity type are formed. For example, it is possible to conduct the concrete method of forming the plurality of second conductivity-type diffusion regions, as follows. When the single crystal silicon substrate 11 prepared in the stage "a" is of p-type, element ions of phosphorus are implanted by an ion implantation method into a plurality of regions (such as a plurality of parallel line shaped regions) of the surface of the single crystal silicon layer 17, and there is conducted an activating treatment for donors at the implanted regions by performing: flash-lamp annealing; laser irradiation of ultraviolet light or deep ultraviolet light having a higher absorption coefficient at the surface of the single crystal silicon layer; or the like; thereby enabling formation of a plurality of p-n junctions. At this time, it is desirable to appropriately adjust an ion implantation amount, a diffusion time, an activation time, and the like, in order to avoid that a plurality of n-type diffusion regions are overlapped with one another into a single region. Further, such a formation of the plurality of p-n junctions may be conducted in a manner: to prepare a paste-like composite containing phosphorus for forming donors; to coat the composite onto a plurality of regions (such as a plurality of parallel line shaped regions) of the surface of the single crystal silicon layer 17 such as by screen printing; and to conduct a diffusion treatment and an activating treatment for the coated composite by, flash-lamp annealing, laser irradiation of ultraviolet light or deep ultraviolet light having a higher absorption coefficient at the surface of the single crystal silicon layer, an infrared furnace, or the like.

Note that the second conductivity-type regions 22 may be formed deeply to reach the joining interface between the single crystal silicon layer 17 and the transparent insulator substrate 12.

Further, it is possible to form high-concentration diffusion regions having a first conductivity type among the plurality of second conductivity-type diffusion regions while forming the latter. For example, in case of diffusing phosphorus or the like into a plurality of regions of the p-type silicon substrate to bring them into a plurality of n-type diffusion regions, it is possible that an element such as boron for forming acceptors is subjected to a diffusion treatment and an activating treatment at a plurality of regions among the plurality of n-type diffusion regions in the same manner, thereby forming a plurality of $p^+$ regions.

Next, there are formed a plurality of first individual electrodes 23 on the plurality of first conductivity-type regions 21 of the single crystal silicon layer 17, respectively, and a plurality of second individual electrodes 24 on the plurality of second conductivity-type regions 22, respectively (stage "g").

For example, the plurality of first individual electrodes 23 are formed on the plurality of first conductivity-type regions 21, respectively, and the plurality of second individual electrodes 24 are formed on the plurality of second conductivity-type regions 22 at the surface of the single crystal silicon layer 17, by adopting a metal or a transparent electroconductive material and by using a vacuum deposition method or a conversion sputtering method. Further, it is possible to adopt various known methods including one to coat a paste-like composite containing metal and the like for forming individual electrodes onto the predetermined regions such as by printing, followed by curing based on a heat treatment.

Note that attention is to be paid at this time such that the first individual electrodes 23 are not joined to the second conductivity-type regions 22 and the second individual electrodes 24 are not joined to the first conductivity-type regions 21, respectively.

Note that the diffusion region formation at the stage "f" and the individual electrode formation at the stage "g" can be simultaneously conducted, as follows. Namely, it is possible to coat an electrode formation composite containing a dopant material to be matured into donors or acceptors onto the predetermined regions by printing or ink jetting, and to conduct a heat treatment to thereby cure and form a plurality of electrodes and diffuse the dopant simultaneously therewith. Also in this case, the heat treatment can be conducted by: flash-lamp annealing; laser irradiation of ultraviolet light or deep ultraviolet light having a higher absorption coefficient at the surface of the single crystal silicon layer; an infrared furnace; or the like.

Meanwhile, in order to provide the solar cell according to the present invention as a see-through type which can be seen through from one surface side toward the other surface side, it is desirable that the individual electrode formation composite is coated at intervals of 10 µm or more, more preferably 100 µm or more. Since the single crystal silicon layer 17 according to the present invention is free of crystal grain boundaries such that mobilities of optically produced carriers and lifetimes thereof are the same as those in an ordinary single crystal silicon substrate, it is allowed to cause intervals of the individual electrode formation composite to be widened than those for a polycrystalline silicon thin-film and an amorphous silicon thin-film, which also contributes to improvement of the visible light transmissivity of the solar cell according to the present invention.

Next, there are formed a first collector electrode 25 for connecting the plurality of first individual electrodes 23 to one another and a second collector electrode 26 for connecting the plurality of second individual electrodes 24 (stage "h").

At this time, although the manner of connection is not particularly limited, it is required that the first collector electrode 25 is prevented from contacting with the second conductivity-type regions 22 and the second individual electrodes 24, and the second collector electrode 26 is prevented from contacting with the first conductivity-type regions 21 and the first individual electrodes 23.

Forming the first collector electrode 25 and second collector electrode 26 in this way allows for effective extraction of electrons and holes collected in the plurality of first individual electrodes 23 and the plurality of second individual electrodes 24, respectively.

It is further possible to additionally form a protective film or the like made of silicon nitride or the like on the single crystal silicon layer 17, after formation of the various electrodes.

The single crystal silicon solar cell produced by the stages "a" through "h" is a single crystal silicon solar cell 31, which is free of occurrence of heat distortion, debonding, cracks, and the like upon production, which is thin and has an excellent uniformity of film thickness, which is excellent in crystallinity, and which has a single crystal silicon layer on a transparent insulator substrate.

Note that the remaining single crystal silicon substrate after delaminative transference of the single crystal silicon layer 17 therefrom in the stage "e", can be again utilized as a single crystal silicon substrate 11, by conducting a treatment of polishing, smoothing, and removing the rough surface and the ion implanted layer after delamination, and by conducting an ion implantation treatment repeatedly. Since it is unnecessary in the method for producing a single crystal silicon solar cell of the present invention to heat the single crystal silicon substrate to a temperature of 300° C. or higher throughout the ion implantation stage to the delamination stage, there is no possibility that defects induced by oxygen are introduced into the single crystal silicon substrate. As such, it becomes possible to conduct delaminative transference as many as 100 or more times, in case of firstly adopting a single crystal silicon substrate having a thickness slightly less than 1 mm and setting the film thickness of a single crystal silicon layer 17 to be 5 μm.

Figure 2:
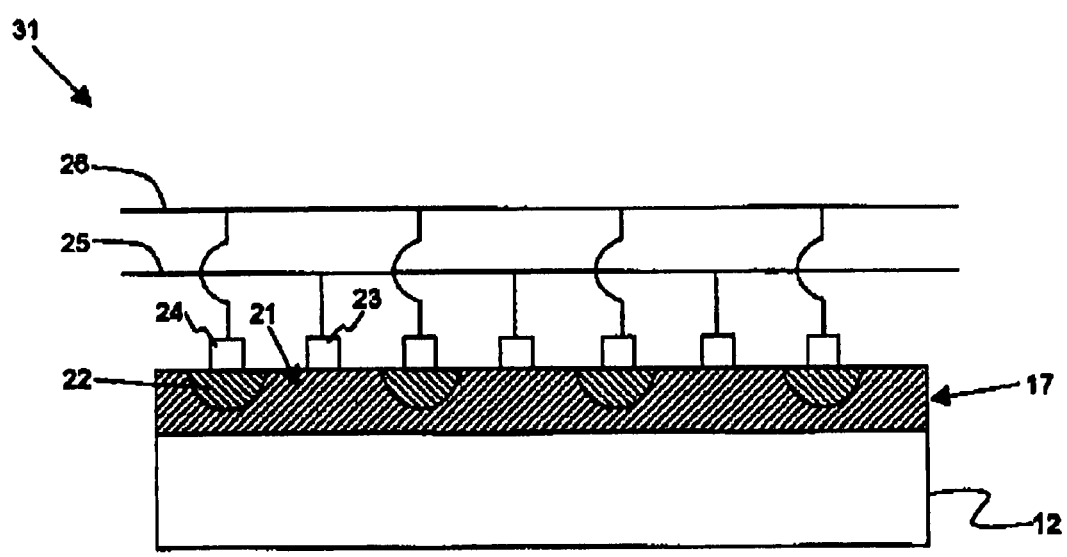
FIG. 2 is a schematic cross-sectional view of an example of a single crystal silicon solar cell according to the present invention.

As schematically shown in FIG. 2, the single crystal silicon solar cell 31 produced by such a production method is configured such that: the transparent insulator substrate 12 such as made of quartz glass, crystallized glass, borosilicate glass, soda-lime glass, or the like, and the single crystal silicon layer 17 are laminated to each other; the single crystal silicon layer 17 is formed with the plurality of first conductivity-type regions 21 and the plurality of second conductivity-type regions 22 at a surface (delaminated surface) side opposite to the transparent insulator substrate 12 side; the plurality of p-n junctions are formed at least in the plane direction (i.e., normal lines of p-n junction interfaces have at least a component oriented in the plane direction of the single crystal silicon layer 17); the plurality of first conductivity-type regions 21 of the single crystal silicon layer 17 are formed thereon with the plurality of first individual electrodes 23, respectively; the plurality of second conductivity-type regions 22 are formed thereon with the plurality of second individual electrodes 24, respectively; and the first collector electrode 25 is formed to connect the plurality of first individual electrodes 23 to one another, and the second collector electrode 26 is formed to connect the plurality of second individual electrodes 24 to one another.

When the single crystal silicon layer 17 has a thickness between 0.1 μm and 5 μm, it is possible to obtain a practical efficiency as a thin-film single crystal silicon solar cell and to sufficiently save an amount of silicon material to be used. Further, the single crystal silicon solar cell having such a thickness of single crystal silicon layer is assuredly capable of transmitting part of visible light therethrough and thus becoming transparent.

Further, the single crystal silicon solar cell 31 according to the present invention can be seen through from one surface side toward the other surface side, and it is possible in this case to adopt either of the transparent insulator substrate 12 side or the side formed with the various electrodes, as a light receiving surface.

Example

Prepared as a single crystal silicon substrate 11 was a single crystal silicon substrate of a p-type, having a diameter of 200 mm (8 inches), one surface which was mirror-polished, a crystal face (100), and a specific resistance of 15 Ω·cm. Further prepared as a transparent insulator substrate 12 was a quartz glass substrate having a diameter of 200 mm (8 inches) and a thickness of 2.5 mm (stage "a"). Note that surfaces of both substrates were polished by chemical mechanical polishing (CMP) in a manner to obtain mirror surfaces each having an averaged roughness of 0.3 nm or less in 10 μm×10 μm scanning by an atomic force microscope (AFM).

Next, hydrogen cations were implanted into the single crystal silicon substrate 11 at the surface thereof subjected to the polishing, under a condition of an acceleration voltage of 350 keV and a dosage of $10 \times 10^{17}/cm^2$ (stage "b"). This resulted in a depth of an ion implanted layer 14 at about 3 μm from an ion implanting surface 13.

Next, there was conducted a surface activating treatment for the ion implanting surface 13 of the single crystal-silicon substrate 11 and the polished surface of the quartz glass substrate 12, by a reduced pressure plasma method for exposing the surfaces to nitrogen plasma for 15 seconds (stage "c").

Subsequently, the single crystal silicon substrate 11 and the quartz glass substrate 12 were strongly bonded to each other, by using the surfaces subjected to the surface activating treatment as bonding surfaces, respectively (stage "d"). After bonding, there was conducted a bonding heat treatment at a temperature of 180° C. for 16 hours in the atmospheric air by using a clean oven.

Thereafter, the temperature was brought back to a room temperature, and there was blown a high pressure nitrogen gas onto the vicinity of the joining interface, followed by conduction of mechanical delamination for delaminating the single crystal silicon substrate in a manner to initiate the delamination from the blown surface (stage "e"). At this time, the delamination was conducted after suckingly attaching auxiliary substrates from the back to the single crystal silicon substrate and quartz glass substrate, respectively. Further, irradiation was conducted onto the delaminatedly transferred single crystal silicon by flash-lamp annealing under a condition that the surface of the single crystal silicon was momentarily brought to a temperature of 700° C. or higher, thereby healing hydrogen implantation damages.

Formed on the surface of the single crystal silicon layer 17 was a pattern of line widths of 50 μm at intervals of 1 mm by screen printing, made of a diffusion paste containing ethyl cellosolve including phosphosilicate glass as a thickener. Irradiation was conducted thereto by a flash lamp such that the surface was momentarily heated to 600° C. or higher, thereby forming a plurality of n-type diffusion regions 22 each at a joining depth of about 0.2 μm (stage "f"). This resulted in alternating presence of p-type regions 21 and n-type regions 22 at the surface of the single crystal silicon layer 17, thereby forming a plurality of p-n junctions in the plane direction.

This diffusion paste was subjected to removal and cleaning by hydrofluoric acid, acetone, and isopropyl alcohol, followed by formation of first individual electrodes 23 on the plurality of p-type region 21 and second individual electrodes 24 on the plurality of n-type regions 22, respectively, by vacuum deposition and patterning while adopting silver as an electrode material (stage "g").

Subsequently, there were formed a first collector electrode 25 for connecting the plurality of first individual electrodes 23 to one another and a second collector electrode 26 for connecting the plurality of second individual electrodes 24 to one another, by vacuum deposition with metal masks, respectively, while adopting silver as electrode materials (stage "h"). There was then formed a protective coating of silicon nitride over the surface by reactive sputtering, except for portions of pickup electrodes.

In this way, there was produced a thin-film single crystal silicon solar cell 31 as shown in FIG. 2, in such a configuration that: the transparent insulator substrate and the single crystal silicon layer are laminated to each other; the single crystal silicon layer is formed with the plurality of p-type regions and the plurality of n-type regions at the surface side opposite to the transparent insulator substrate side; the plurality of p-n junctions are formed at least in the plane direction; the plurality of p-type regions of the single crystal silicon layer are formed thereon with the plurality of first individual electrodes, respectively; the plurality of n-type regions are formed thereon with the plurality of second individual electrodes, respectively; and the first collector electrode is formed to connect the plurality of first individual electrodes to one another, and the second collector electrode is formed to connect the plurality of second individual electrodes to one another.

Irradiated to the thus produced single crystal silicon solar cell was a light of 100 mW/cm$^2$ under AM1.5 conditions by a solar simulator, thereby measuring a conversion efficiency. The conversion efficiency was 8.5%, and timewise change was not observed.

Further, it was possible to see a situation in a room by looking thereinto through the solar cell while allowing outside light to enter the room therethrough during a fine day.

Note that the present invention is not limited to the above embodiment. The embodiment is merely exemplary, and whatever has substantially the same configuration and exhibit the same functions and effects as the technical concept recited in the appended claims of the present application shall be embraced within the technical concept of the present invention.

The invention claimed is:

1. A method for producing a single crystal silicon solar cell, the solar cell including a transparent insulator substrate and a single crystal silicon layer arranged over the transparent insulator substrate and acting as a light conversion layer, the method comprising at least the steps of:
    preparing the transparent insulator substrate and a single crystal silicon substrate having a first conductivity type;
    implanting at least one of hydrogen ions and rare gas ions into the single crystal silicon substrate through an ion implanting surface thereof to form an ion implanted layer in the single crystal silicon substrate;
    conducting a surface activating treatment for at least one of: the ion implanting surface of the single crystal silicon substrate; and at least one surface of the transparent insulator substrate;
    bonding the ion implanting surface of the single crystal silicon substrate and the transparent insulator substrate to each other, in a manner that the surface(s) subjected to the surface activating treatment is/are used as a bonding surface(s);
    applying an impact to the ion implanted layer to mechanically delaminate the single crystal silicon substrate thereat at room temperature to leave a single crystal silicon layer;
    forming a plurality of diffusion regions having a second conductivity type at the delaminated surface side of the single crystal silicon layer, which conductivity type is different from the first conductivity type, in a manner that a plurality of p-n junctions are formed at least in the plane direction, and that the plurality of first conductivity-type regions and the plurality of second conductivity-type regions are present at the delaminated surface of the single crystal silicon layer;
    forming a plurality of first individual electrodes on the plurality of first conductivity-type regions of the single crystal silicon layer, respectively, and a plurality of second individual electrodes on the plurality of second conductivity-type regions, respectively; and
    forming a first collector electrode for connecting the plurality of first individual electrodes to one another and a second collector electrode for connecting the plurality of second individual electrodes to one another,
    wherein the transparent insulator substrate is made of any one of crystallized glass, borosilicate glass, and soda-lime glass.

2. The method for producing a single crystal silicon solar cell according to claim 1, wherein the surface activating treatment is at least one of a plasma treatment and an ozone treatment.

3. The method for producing a single crystal silicon solar cell according to claim 1, wherein the ion implantation is conducted at a depth between 0.1 μm inclusive and 5 μm inclusive from the ion implanting surface.

4. The method for producing a single crystal silicon solar cell according to claim 2, wherein the ion implantation is conducted at a depth between 0.1 μm inclusive and 5 μm inclusive from the ion implanting surface.

* * * * *